US010597779B2

United States Patent
Weaver et al.

(10) Patent No.: US 10,597,779 B2
(45) Date of Patent: Mar. 24, 2020

(54) SUSCEPTOR POSITION AND RATIONAL APPARATUS AND METHODS OF USE

(71) Applicant: Applied Materials, Inc., Santa Clara, CA (US)

(72) Inventors: William T. Weaver, Austin, TX (US); Robert Brent Vopat, Austin, TX (US); Joseph Yudovsky, Campbell, CA (US); Jason M. Schaller, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 695 days.

(21) Appl. No.: 15/163,857

(22) Filed: May 25, 2016

(65) Prior Publication Data

US 2016/0355927 A1    Dec. 8, 2016

Related U.S. Application Data (60) Provisional application No. 62/171,968, filed on Jun. 5, 2015.

(51) Int. Cl.
*C23C 16/458* (2006.01)
*C23C 16/455* (2006.01)
*H01L 21/687* (2006.01)

(52) U.S. Cl.
CPC ...... *C23C 16/4585* (2013.01); *C23C 16/4584* (2013.01); *C23C 16/45551* (2013.01); *H01L 21/68764* (2013.01); *H01L 21/68771* (2013.01); *H01L 21/68785* (2013.01); *H01L 21/68792* (2013.01)

(58) Field of Classification Search
CPC .................. C23C 16/455–458; H01L 21/68
See application file for complete search history.

(56) References Cited

U.S. PATENT DOCUMENTS

| | | | | |
|---|---|---|---|---|
| 5,135,349 | A | * | 8/1992 | Lorenz .................... B25J 9/041 414/226.01 |
| 5,373,153 | A | | 12/1994 | Cumberledge et al. |
| 5,444,217 | A | * | 8/1995 | Moore ................ C23C 16/4404 219/405 |
| 5,772,773 | A | * | 6/1998 | Wytman ........... H01L 21/67103 118/729 |
| 6,120,609 | A | * | 9/2000 | Selyutin .............. C23C 16/4583 118/500 |
| 6,821,563 | B2 | | 11/2004 | Yudovsky |

(Continued)

FOREIGN PATENT DOCUMENTS

| | | |
|---|---|---|
| JP | 2003-133233 A | 5/2003 |
| KR | 10-1363083 B1 | 2/2014 |

(Continued)

OTHER PUBLICATIONS

PCT International Preliminary Report on Patentability in PCT/US2016/034039 dated Dec. 14, 2017, 11 pages.

(Continued)

*Primary Examiner* — Tyrone V Hall, Jr.
(74) *Attorney, Agent, or Firm* — Servilla Whitney LLC (57) ABSTRACT

Apparatus and methods for aligning large susceptors in batch processing chambers are described. Apparatus and methods for controlling the parallelism of a susceptor relative to a gas distribution assembly are also described.

16 Claims, 8 Drawing Sheets

(56) References Cited

U.S. PATENT DOCUMENTS

| | | | |
|---|---|---|---|
| 7,927,425 B2 * | 4/2011 | Chiang | H01J 37/32431 118/712 |
| 7,946,799 B2 * | 5/2011 | Uratani | H01L 21/67742 414/744.3 |
| 8,011,874 B2 * | 9/2011 | Uratani | B25J 18/04 414/744.3 |
| 2003/0136520 A1 * | 7/2003 | Yudovsky | C23C 16/45521 156/345.51 |
| 2004/0124594 A1 * | 7/2004 | Muto | H01L 21/68 279/128 |
| 2004/0177813 A1 * | 9/2004 | Schieve | C23C 16/4582 118/728 |
| 2004/0206921 A1 | 10/2004 | Blonigan et al. | |
| 2004/0221808 A1 * | 11/2004 | Kawano | C23C 16/4401 118/715 |
| 2004/0255442 A1 | 12/2004 | McDiarmid et al. | |
| 2006/0054090 A1 * | 3/2006 | Kurita | C23C 16/4586 118/728 |
| 2006/0240542 A1 | 10/2006 | Schieve et al. | |
| 2008/0105069 A1 * | 5/2008 | Binnard | G03F 7/70716 74/16 |
| 2008/0280453 A1 | 11/2008 | Koelmel et al. | |
| 2010/0136773 A1 | 6/2010 | Akae et al. | |
| 2011/0053092 A1 * | 3/2011 | Aoki | B65G 49/065 430/319 |
| 2011/0236599 A1 | 9/2011 | Furuta et al. | |
| 2012/0225195 A1 | 9/2012 | Yudovsky | |
| 2012/0225206 A1 | 9/2012 | Yudovsky | |

FOREIGN PATENT DOCUMENTS

| | | |
|---|---|---|
| WO | 2012118953 A3 | 9/2012 |
| WO | 2014130673 A1 | 8/2014 |
| WO | 2014144533 A1 | 9/2014 |

OTHER PUBLICATIONS

PCT International Search Report and Written Opinion in PCT/US2016/034039 dated Aug. 24, 2016, 14 pages.

* cited by examiner

SUSCEPTOR POSITION AND RATIONAL APPARATUS AND METHODS OF USE

CROSS-REFERENCE TO RELATED APPLICATIONS

The application claims priority to U.S. Provisional Application No. 62/171,968, filed Jun. 5, 2015, the entire disclosure of which is incorporated by reference herein.

TECHNICAL FIELD

The present disclosure relates generally to apparatus and methods for positioning and/or rotating a susceptor assembly. More specifically, embodiments of the disclosure are directed to apparatus and methods for moving a batch processing susceptor assembly in multiple axes.

BACKGROUND

Some batch processing chambers have relatively large diameter susceptors (1 m or more) to hold a sufficient number of wafers for processing. The susceptor is rotated in close proximity (3 mm-0.5 mm) to the injector plate which is another large diameter disc-like component. The parallelism between these components is tuned to control the deposition process. Currently, these components are positioned manually, which takes about three hours. The parallelism changes with respect to the susceptor temperature and chamber pressure. Accordingly, there is a need for apparatus and methods to align and control parallelism to meet the tight clearances and impact of changing process parameters.

SUMMARY

One or more embodiments of the disclosure are directed to susceptor assemblies comprising a shaft that can support a susceptor and a positioning system. The positioning system comprises a bottom plate, a top plate and at least three actuators positioned between and in contact with the bottom plate and the top plate. Each of the actuators has a body and a rod with a rod end positioned within the body. Each rod is slidably movable along an axis of the body to move the top plate closer to or further from the bottom plate.

Additional embodiments of the disclosure are directed to processing chambers comprising a vacuum chamber having a bottom with an opening therethrough. A susceptor assembly comprises a shaft that can support a susceptor and a positioning system. The positioning system comprises a bottom plate, a top plate and at least three actuators positioned between and in contact with the bottom plate and the top plate. Each of the actuators has a body and a rod with a rod end positioned within the body. Each rod is slidably movable along an axis of the body to move the top plate closer to or further from the bottom plate. The susceptor assembly is positioned so that the shaft extends through the opening in the bottom of the vacuum chamber. A susceptor is connected to a top of the shaft within the vacuum chamber.

Additional embodiments of the disclosure are directed to processing chambers comprising a vacuum chamber with a bottom with an opening therethrough. A shaft extends through the opening and supports a susceptor within the vacuum chamber. A bearing assembly includes a spherical roller bearing positioned around the shaft to form a seal between the shaft and the vacuum chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways. The embodiments described and illustrations are intended as examples only and are not to be construed as limiting the disclosed apparatus or method.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

According to one or more embodiments, the apparatus and methods can be used with an atomic layer deposition (ALD) process. In such embodiments, the substrate surface is exposed to the precursors (or reactive gases) sequentially or substantially sequentially. As used herein throughout the specification, "substantially sequentially" means that a majority of the duration of a precursor exposure does not overlap with the exposure to a co-reagent, although there may be some overlap. As used in this specification and the appended claims, the terms "precursor", "reactant", "reactive gas" and the like are used interchangeably to refer to any gaseous species that can react with the substrate surface.

The various embodiments described can be employed with any type of system in which multi-axis motion is used. For descriptive purposes, embodiments are shown in use with a spatial ALD batch processing chamber. Those skilled in the art will understand that the apparatus and methods may be adapted for use in other environments or with other processing chambers. For example, a time-domain ALD processing chamber, a chemical vapor deposition chamber.

Figure 1:
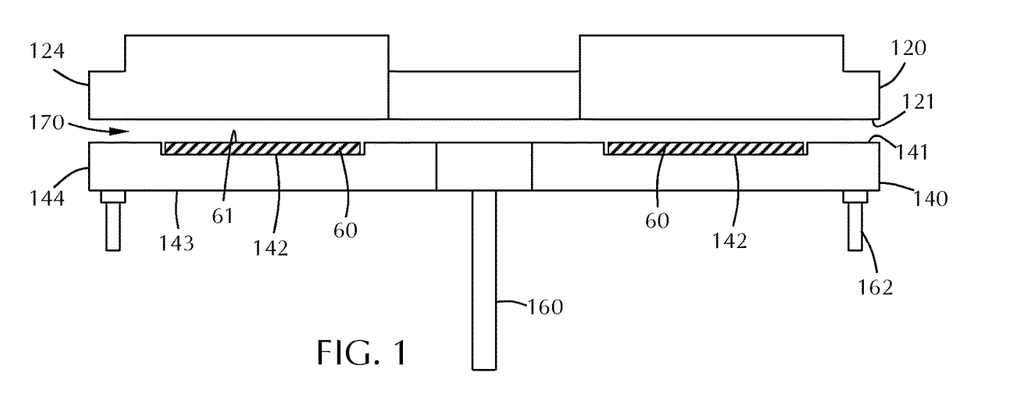
FIG. 1 shows a cross-sectional view of a batch processing chamber in accordance with one or more embodiment of the disclosure.

FIG. 1 shows a cross-section of a batch processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which in the embodiments shown, is substantially round.

The specific type of gas distribution assembly 120 used can vary depending on the particular process being used. Embodiments of the disclosure can be used with any type of processing system where the gap between the susceptor and the gas distribution assembly is controlled. In a binary reaction, the plurality of gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s).

Figure 2:
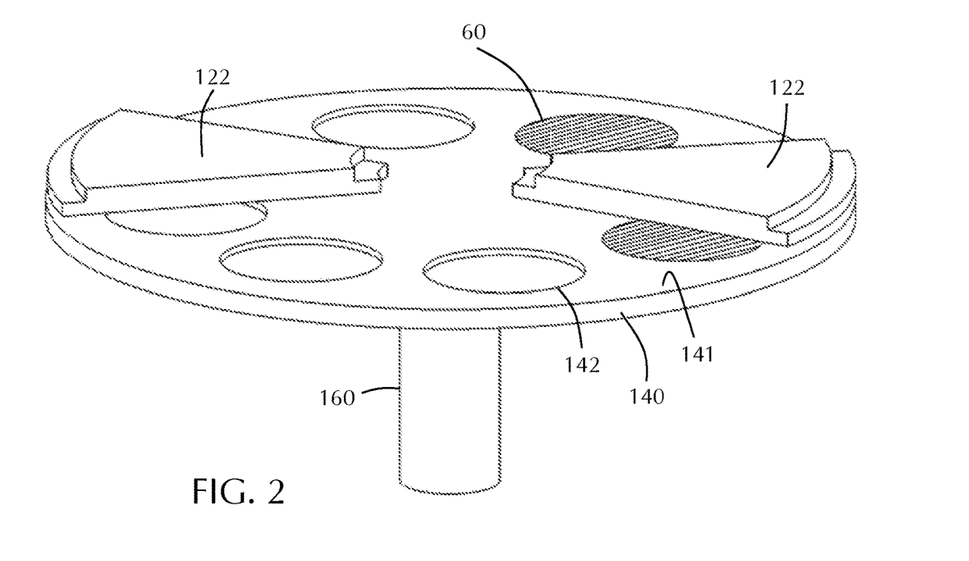
FIG. 2 shows a partial perspective view of a batch processing chamber in accordance with one or more embodiment of the disclosure.

In some embodiments, the gas distribution assembly 120 is a rigid stationary body made of a single injector unit. In one or more embodiments, the gas distribution assembly 120 is made up of a plurality of individual sectors (e.g., injector units 122), as shown in FIG. 2. Either a single piece body or a multi-sector body can be used with the various embodiments of the disclosure described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144. The recess 142 can be any suitable shape and size depending on the shape and size of the substrates 60 being processed. In the embodiment shown in FIG. 1, the recess 142 has a flat bottom to support the bottom of the wafer; however, the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a substrate 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.5 mm, ±0.4 mm, ±0.3 mm, ±0.25 mm, ±0.2 mm, ±0.15 mm, ±0.10 mm or ±0.05 mm.

The susceptor assembly 140 of FIG. 1 includes a shaft 160 which is capable of lifting, lowering and rotating the susceptor assembly 140. The susceptor assembly may include a heater, or gas lines, or electrical components within the center of the shaft 160. The shaft 160 may be the primary means of increasing or decreasing the gap between the susceptor assembly 140 and the gas distribution assembly 120, moving the susceptor assembly 140 into proper position. The susceptor assembly 140 may also include fine tuning actuators 162 which can make micro-adjustments to susceptor assembly 140 to create a predetermined gap 170 between the susceptor assembly 140 and the gas distribution assembly 120. In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of substrates 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload substrates 60.

Figure 3:
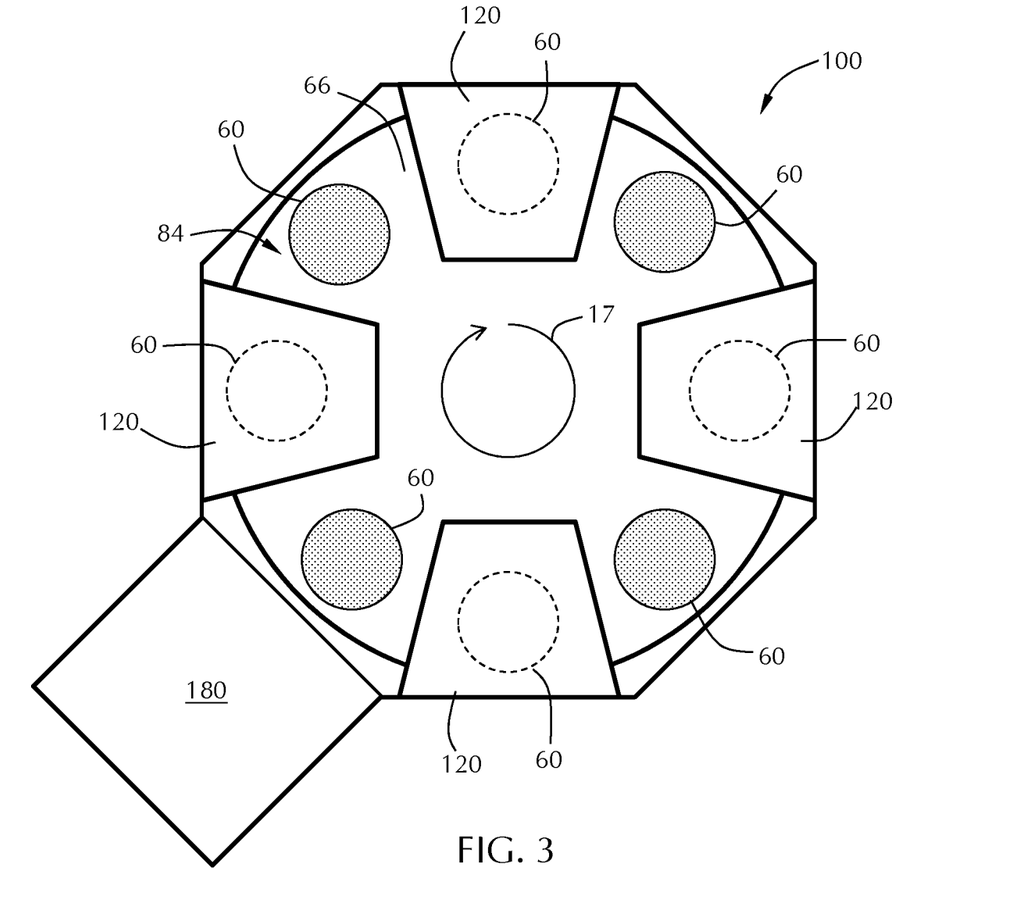
FIG. 3 shows a schematic view of a batch processing chamber in accordance with one or more embodiment of the disclosure.

Processing chambers having multiple gas injectors can be used to process multiple wafers simultaneously so that the wafers experience the same process flow. For example, as shown in FIG. 3, the processing chamber 100 has four gas injector assemblies and four substrates 60. At the outset of processing, the substrates 60 can be positioned between the injector assemblies 30. Rotating 17 the susceptor assembly 140 by 45° will result in each substrate 60 which is between gas distribution assemblies 120 to be moved to a gas distribution assembly 120 for film deposition, as illustrated by the dotted circle under the gas distribution assemblies 120. An additional 45° rotation would move the substrates 60 away from the injector assemblies 30. With spatial ALD injectors, a film is deposited on the wafer during movement of the wafer relative to the injector assembly. In some embodiments, the susceptor assembly 140 is rotated in increments that prevent the substrates 60 from stopping beneath the gas distribution assemblies 120. The number of substrates 60 and gas distribution assemblies 120 can be the same or different. In some embodiments, there is the same number of wafers being processed as there are gas distribution assemblies. In one or more embodiments, the number of wafers being processed are fraction of or an integer multiple of the number of gas distribution assemblies. For example, if there are four gas distribution assemblies, there are 4x wafers being processed, where x is an integer value greater than or equal to one.

The processing chamber 100 shown in FIG. 3 is merely representative of one possible configuration and should not be taken as limiting the scope of the disclosure. Here, the processing chamber 100 includes a plurality of gas distribution assemblies 120. In the embodiment shown, there are four gas distribution assemblies (also called injector assemblies 30) evenly spaced about the processing chamber 100. The processing chamber 100 shown is octagonal, however, those skilled in the art will understand that this is one possible shape and should not be taken as limiting the scope of the disclosure. The gas distribution assemblies 120 shown are trapezoidal, but can be a single circular component or made up of a plurality of pie-shaped segments, like that shown in FIG. 2.

The embodiment shown in FIG. 3 includes a load lock chamber 180, or an auxiliary chamber like a buffer station. This chamber 180 is connected to a side of the processing chamber 100 to allow, for example the substrates (also referred to as substrates 60) to be loaded/unloaded from the chamber 100. A wafer robot may be positioned in the chamber 180 to move the substrate onto the susceptor.

Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where the carousel can pause again. Pausing between the injectors may provide time for additional processing steps between each layer deposition (e.g., exposure to plasma).

Figure 4:
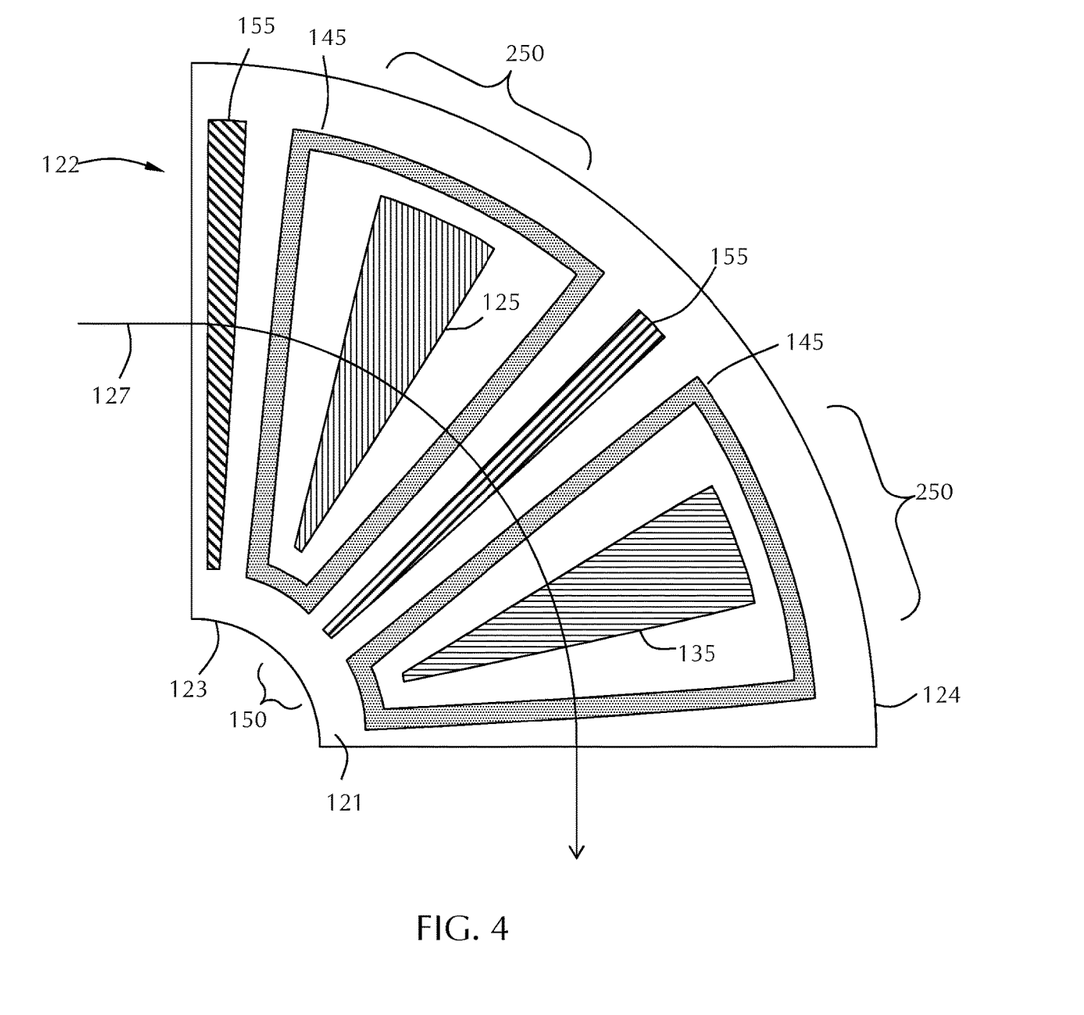
FIG. 4 shows a schematic view of a portion of a wedge shaped gas distribution assembly for use in a batch processing chamber in accordance with one or more embodiment of the disclosure.
Figure 5:
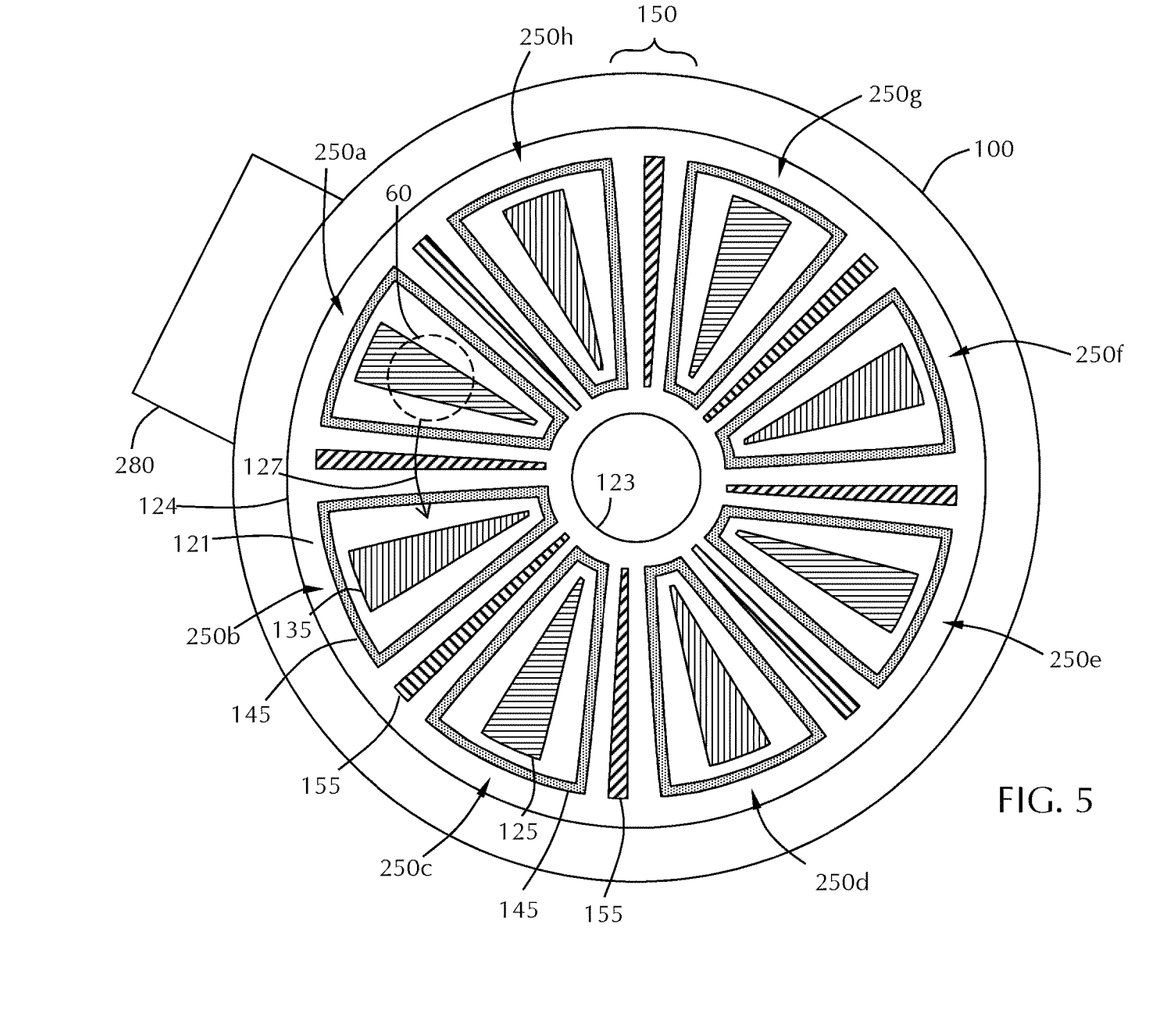
FIG. 5 shows a schematic view of a batch processing chamber in accordance with one or more embodiment of the disclosure.

FIG. 4 shows a sector or portion of a gas distribution assembly 220, which may be referred to as an injector unit 122. The injector units 122 can be used individually or in combination with other injector units. For example, as shown in FIG. 5, four of the injector units 122 of FIG. 4 are combined to form a single gas distribution assembly 220. (The lines separating the four injector units are not shown for clarity.) While the injector unit 122 of FIG. 4 has both a first reactive gas port 125 and a second reactive gas port 135 in addition to purge gas ports 155 and vacuum ports 145, an injector unit 122 does not need all of these components.

Referring to both FIGS. 4 and 5, a gas distribution assembly 220 in accordance with one or more embodiment may comprise a plurality of sectors (or injector units 122) with each sector being identical or different. The gas distribution assembly 220 is positioned within the processing chamber and comprises a plurality of elongate gas ports 125, 135, 155 and vacuum ports 145 in a front surface 121 of the gas distribution assembly 220. The plurality of elongate gas ports 125, 135, 155 and vacuum ports 145 extend from an area adjacent the inner peripheral edge 123 toward an area adjacent the outer peripheral edge 124 of the gas distribution assembly 220. The plurality of gas ports shown include a first reactive gas port 125, a second reactive gas port 135, a vacuum port 145 which surrounds each of the first reactive gas ports and the second reactive gas ports and a purge gas port 155.

With reference to the embodiments shown in FIG. 4 or 5, when stating that the ports extend from at least about an inner peripheral region to at least about an outer peripheral region, however, the ports can extend more than just radially from inner to outer regions. The ports can extend tangentially as vacuum port 145 surrounds reactive gas port 125 and reactive gas port 135. In the embodiment shown in FIGS. 4 and 5, the wedge shaped reactive gas ports 125, 135 are surrounded on all edges, including adjacent the inner peripheral region and outer peripheral region, by a vacuum port 145.

Referring to FIG. 4, as a substrate moves along path 127, each portion of the substrate surface is exposed to the various reactive gases. To follow the path 127, the substrate will be exposed to, or "see", a purge gas port 155, a vacuum port 145, a first reactive gas port 125, a vacuum port 145, a purge gas port 155, a vacuum port 145, a second reactive gas port 135 and a vacuum port 145. Thus, at the end of the path 127 shown in FIG. 4, the substrate has been exposed to gas streams from the first reactive gas port 125 and the second reactive gas port 135 to form a layer. The injector unit 122 shown makes a quarter circle but could be larger or smaller. The gas distribution assembly 220 shown in FIG. 5 can be considered a combination of four of the injector units 122 of FIG. 4 connected in series.

The injector unit 122 of FIG. 4 shows a gas curtain 150 that separates the reactive gases. The term "gas curtain" is used to describe any combination of gas flows or vacuum that separate reactive gases from mixing. The gas curtain 150 shown in FIG. 4 comprises the portion of the vacuum port 145 next to the first reactive gas port 125, the purge gas port 155 in the middle and a portion of the vacuum port 145 next to the second reactive gas port 135. This combination of gas flow and vacuum can be used to prevent or minimize gas phase reactions of the first reactive gas and the second reactive gas.

Referring to FIG. 5, the combination of gas flows and vacuum from the gas distribution assembly 220 form a separation into a plurality of processing regions 250. The processing regions are roughly defined around the individual reactive gas ports 125, 135 with the gas curtain 150 between 250. The embodiment shown in FIG. 5 makes up eight separate processing regions 250 with eight separate gas curtains 150 between. A processing chamber can have at least two processing region. In some embodiments, there are at least three, four, five, six, seven, eight, nine, 10, 11 or 12 processing regions.

During processing a substrate may be exposed to more than one processing region 250 at any given time. However, the portions that are exposed to the different processing regions will have a gas curtain separating the two. For example, if the leading edge of a substrate enters a processing region including the second reactive gas port 135, a middle portion of the substrate will be under a gas curtain 150 and the trailing edge of the substrate will be in a processing region including the first reactive gas port 125.

A factory interface 280, which can be, for example, a load lock chamber, is shown connected to the processing chamber 100. A substrate 60 is shown superimposed over the gas distribution assembly 220 to provide a frame of reference. The substrate 60 may often sit on a susceptor assembly to be held near the front surface 121 of the gas distribution assembly 120 (also referred to as a gas distribution plate). The substrate 60 is loaded via the factory interface 280 into the processing chamber 100 onto a substrate support or susceptor assembly (see FIG. 3). The substrate 60 can be shown positioned within a processing region because the substrate is located adjacent the first reactive gas port 125 and between two gas curtains 150a, 150b. Rotating the substrate 60 along path 127 will move the substrate counterclockwise around the processing chamber 100. Thus, the substrate 60 will be exposed to the first processing region 250a through the eighth processing region 250h, including all processing regions between. For each cycle around the processing chamber, using the gas distribution assembly shown, the substrate 60 will be exposed to four ALD cycles of first reactive gas and second reactive gas.

Figures 6, 7, 8A, 8B:
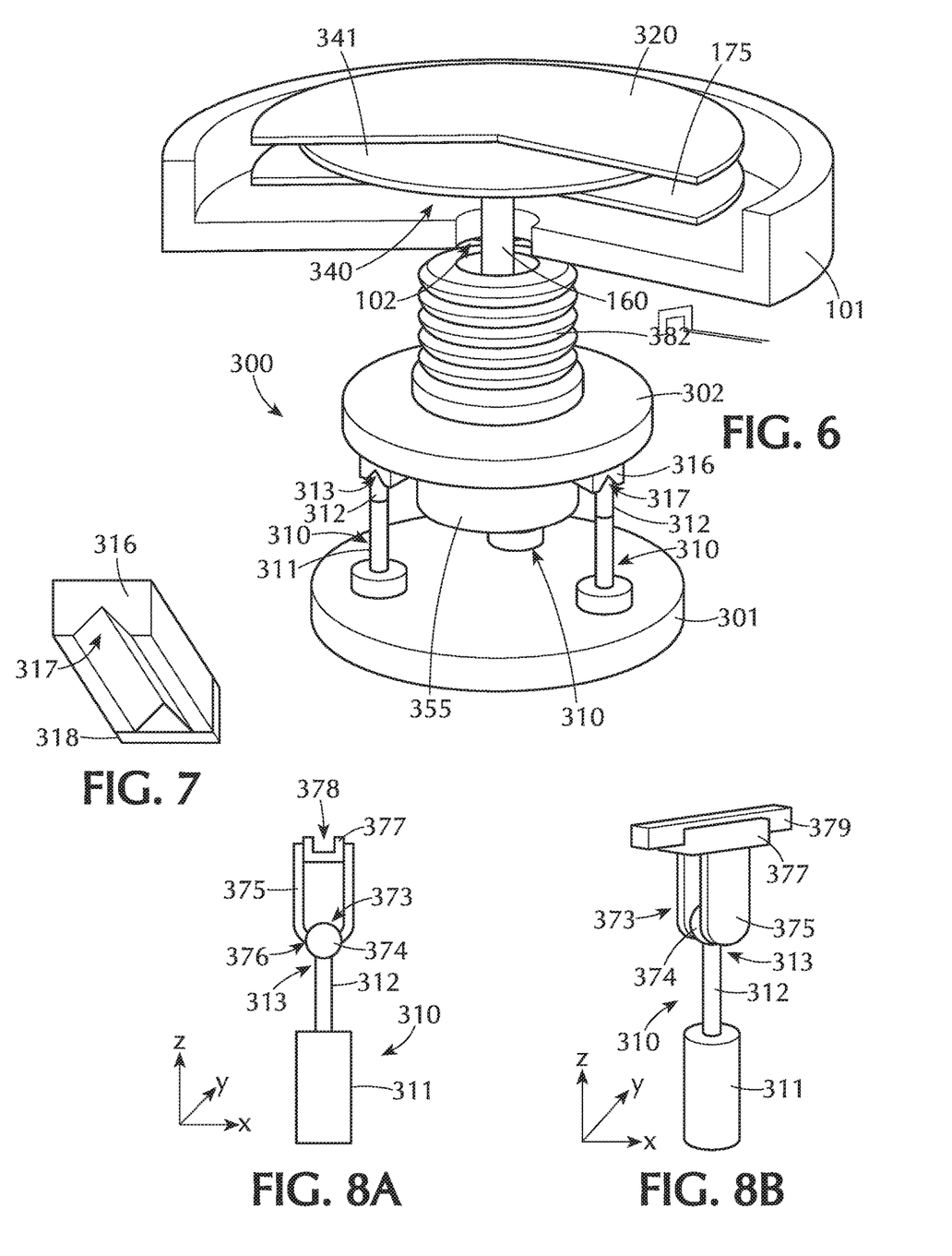
FIG. 6 shows a partial perspective view of a batch processing chamber in accordance with one or more embodiment of the disclosure.
FIG. 7 shows a perspective view of a v-block for use with one or more embodiments of the disclosure.
FIGS. 8A and 8B show linear actuators with spherical rod ends in accordance with one or more embodiment of the disclosure.

A precision linear positioning system with four axes of motion can be used to position the susceptor in close proximity to the gas injector. This can be seen in FIG. 6. The position system can be constructed using a bottom plate with three equally spaced linear actuators rigidly mounted perpendicular to the bottom plate surface. Each actuator can provide precision vertical motion and is coupled to the top plate with a 4-degree-of-freedom (4-DOF) joint. In some embodiments, as shown in FIGS. 8A and 8B, the 4-DOF joint can comprise a spherical rod in bearing attached to a linear bearing. In some embodiments, the 4-DOF joint comprises a kinematic coupling feature (see FIG. 9) that provides pitch, yaw, roll and one linear degree of freedom aligned with the center of the top plate. The rotation access for the susceptor can be integrated to the top plate for processing and adding the fourth axis of motion. In one or more embodiments, the system provides position repeatability to less than 0.005 inches.

FIG. 6 shows a processing chamber incorporating a susceptor assembly according to one or more embodiment of the disclosure. The susceptor assembly 340 includes a shaft 160 that can support a susceptor 341. The susceptor 340 is shown as a flat plate but can also include recesses or pockets like those shown in FIG. 2.

Referring back to FIG. 6, a positioning system 300 communicates with the shaft 160 to move the susceptor 341. As used in this regard, the term "communicates" means that at least one of the components is capable of affecting the position of or is in contact, either directly or indirectly, with another component. The positioning system 300 of some embodiments can move the susceptor 341 along the z-axis (i.e., up and down in the Figures), along the x-axis or y-axis to cause the susceptor 341 to tilt relative to the gas distribution assembly 320.

The positioning system 300 in FIG. 6 comprises a bottom plate 301, a top plate 302 and at least three actuators 310. Each of the actuators 310 are positioned between and in contact with the bottom plate 301 and the top plate 302. Each of the actuators 310 has a body 311 and a rod 312 with a rod end 313 movable within the body 311. Each of the rods 312 are slidably movable within the body so that the length of the rod extending from the body can be varied. Thus, the rods 312 can be moved along an axis of the body 311 to move the top plate 302 closer to or further from the bottom plate 301. As used herein the movement of the susceptor 341 closer to or further from the gas distribution assembly 320 is referred to as movement along the z-axis.

The embodiment shown in FIG. 6 includes v-blocks 316 which each actuator is in contact with. FIGS. 8A and 8B show an expanded view of a v-block 316. The groove 317 in the v-block 316 is aligned radially with respect to the center of the top plate 302. As used in this regard, the "center" of the top plate 302 means the center of the motion with respect to the actuators and shaft. The shape of the top plate may be concentric about the center or can be irregular. The radial alignment with the center of movement allows the end 313 of the rod 312 to slide along the length defined along the groove 317, of the v-block toward and away from the center.

In some embodiments, the v-block 316 further comprises an end plate 318 positioned on either or both ends of the v-block 316. The v-block 316 can be positioned so that the end plate 318 is at the outer end of the v-block 316 so that movement of the end 313 of the rod 312 cannot extend further from the center than the end plate 318.

The embodiment shown in FIG. 6 is gravity supported so that there is no mechanical connection between the end 313 of the rod 312 and the top plate 302. In some embodiments, there is a mechanical connection between the bottom plate 301 and the top plate 302. For example, FIGS. 8A and 8B show a mechanically connected system in which each actuator 310 is in contact with a linear bearing 379. FIG. 8A shows a front view of the actuator 310 with rod 312 extending from the top of the body 311. In the embodiment shown, the rod end 313 has a spherical bearing 374 to connect with a socket 375. The term "spherical" used in this regard means that the end of the rod has convex sides and does not imply a perfect sphere. The purpose of the convex sides of the spherical bearing 374 is to cooperatively interact with concave portions 376 of the socket 375. The cooperative interaction of the spherical bearing 374 and socket 375 allow the alignment of the bearing and socket to change angles as the rod 312 moves. The socket 375 has a bracket 377 with a channel 378 therethrough. FIG. 8B shows a side view of the actuator of FIG. 8A. The channel 378 of the bracket 377 can cooperatively interact with a linear bearing 379. Just like the v-block 316 of FIG. 6, the linear bearing 379 can be connected to, or integrally formed with, the top plate 302. The linear bearing 379 can be aligned radially with respect to the center of movement of the top plate 302. Movement of the rod 312 will cause the top plate 302 to tilt and the bracket 377 to slide along the length (i.e., the elongate axis) of the linear bearing 379. Without being bound by any particular theory of operation, it is believed that allowing the rod end 313 to slide along either the v-block 316, the linear bearing 379, or other bearing type component, minimizes stress on the components. The bearings of some embodiments allow adequate range of motion and provide positive retention of the supported elements allowing inversion of the elements without disengagement (lifting off the v-blocks).

The combined motion and position of each actuator provides precision pitch, roll and z motion to position, in this embodiment, the susceptor. The movement can align the susceptor to injector assembly to very tight tolerances depending on the resolution/accuracy of the motion actuators used. In some embodiments, the movement can align the susceptor to injector assembly to less than about 0.05, 0.045, 0.04, 0.035, 0.03, 0.025, 0.02, 0.015, 0.01 or 0.005 inches. The motion provided by the positioning system 300 allows for the integration of a vertical actuator arrangement into the vacuum chamber with either a bellows or lip seal. In conventional systems, the entire actuator shaft moves in multiple directions due to a hinged actuator on the bottom plate making vacuum feedthrough difficult to design.

Referring again to FIG. 6, the positioning system 300 can be located outside of the vacuum chamber 101. Here, the bottom of the vacuum chamber 101 has an opening 102 therethrough. The shaft 160 passes through the opening 102 and supports a susceptor 341 inside the vacuum chamber 101 and is in communication with, or connected to, the top plate 302 of the positioning system 300.

To maintain a gas-tight seal on the vacuum chamber 101, a bellows 382 may be included. The bellows 382 of FIG. 6 connects, or contacts, the top plate 302 and the vacuum chamber 101. Movement of the shaft 160 along the z-axis causes the bellows 382 to expand or contract without breaking the vacuum in the vacuum chamber 101. While bellows are shown, those skilled in the art will understand that other sealing mechanisms can be employed. For example, lip seals, magnetic couplings or any other method of sealing a linear motion axis in vacuum.

Figure 9:
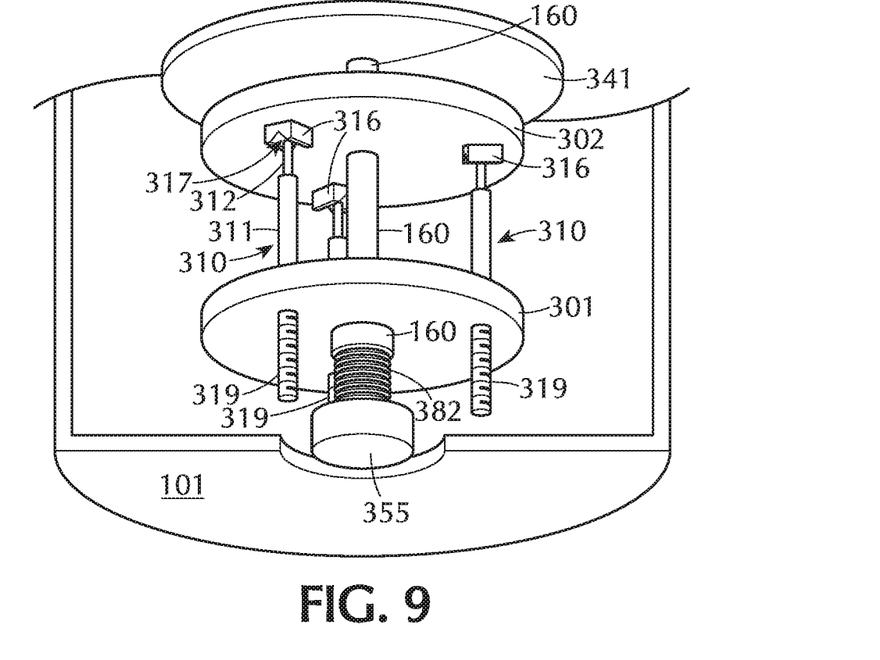
FIG. 9 shows a partial perspective view of a batch processing chamber in accordance with one or more embodiment of the disclosure.

FIG. 9 shows another embodiment in which the positioning system is located within the vacuum chamber 101. Here, the shaft 160 extends through the top plate 302 and the bottom plate 301 of the positioning system 300. The positioning system 300 can be completely located within the vacuum chamber of partially within the vacuum chamber. A bellows 382 is shown below the bottom plate 301 in FIG. 9 to illustrate that a portion of the system 300 can pass through an opening in the vacuum chamber 101 while maintaining a gas-tight seal. The embodiment shown in FIG. 9 includes actuator seals 319 below the bottom plate 301. The actuator seals 319 may provide sufficient space for the movement of the actuators while maintaining a gas-tight seal.

Figure 10:
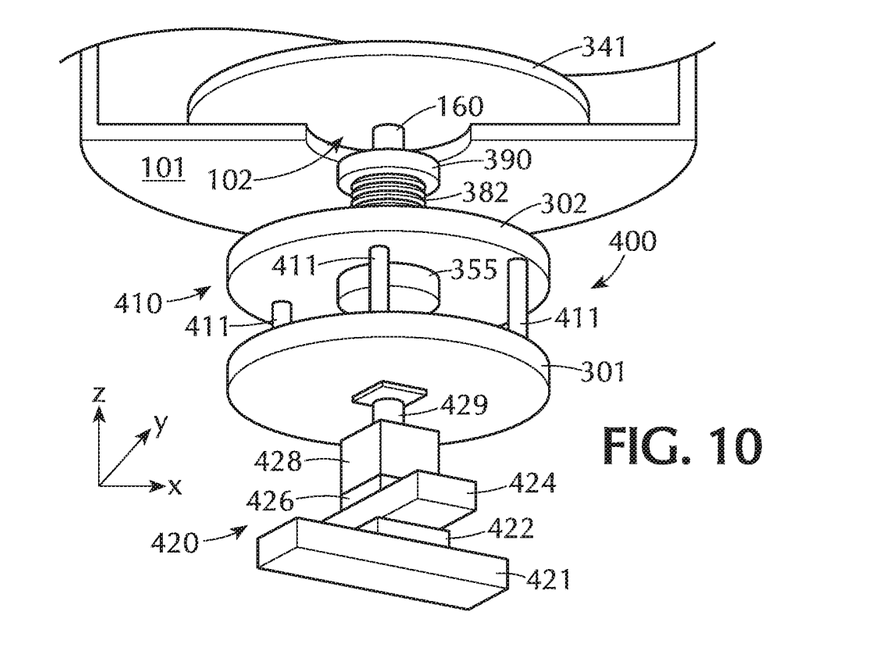
FIG. 10 shows a partial perspective view of a batch processing chamber in accordance with one or more embodiment of the disclosure.

FIG. 10 shows another embodiment of a precision linear positioning system 400 with four axes of motion which can be used to, for example, position a susceptor in close proximity to a gas injector plate. The system can be constructed using a spherical roller bearing 390 attached to the vacuum chamber 101. The roller bearing 390 can be a mechanical bearing or air bearing. The roller bearing 390 provides bearing support for rotation about the z-axis, rotation about the x-axis and rotation about the y-axis. A bellows 382, also referred to as a bellows seal, may be included below the roller bearing 390 to provide a barrier between the process environment and atmosphere while allowing rotation about the x-, y- and z-axes of the rotational lip seal. In some embodiments, a staged vacuum lip seal (not shown) below the bellows provides vacuum isolation barrier for the rotation motion about the z-axis (theta rotation). A rotational motor (also called a theta motor 355) may be attached to the frame 410 of the positioning system 400 to integrate with the lip seal and provide a mounting point for the x, y and z stages 420 that support and actuate the load. The frame 410 with the theta motor 355/lip seal may be attached to an x, y and z stage 420 to provide the precision motion for aligning the susceptor 341 to the injector plate.

The theta motor 355, shown in FIGS. 6, 9 and 10, rotates the shaft 160 to rotate the susceptor 341. The theta motor 355 can be any suitable motor that is able to accurately and consistently rotate the heavy components.

The frame 410 shown in FIG. 10 includes a top plate 302 and bottom plate 301. The top and bottom plates are connected by a plurality of support rods 411. The distance between the top plate 302 and the bottom plate 301 can be any suitable distance depending on the size of components located between. For example, in the embodiment shown in FIG. 10, the minimum distance between the top plate 302 and the bottom plate 301 is the amount of space occupied by the theta motor 355.

The stage 420 shown is made up of a combination of x-axis motors, y-axis motors and z-axis motors. The x-axis motion may be done using an x-axis track 421 with a slidable platform 422 thereon. The platform 422 can move along the length of the x-axis track 421 to tilt the susceptor. The point at which the shaft 160 passes through the opening 102 in the vacuum chamber 101 acts as a mostly fixed point so that moving the platform 422 causes the susceptor to be pivoted about the opening location. The y-axis motion may be done using a y-axis track 424 with a slidable platform 426 thereon. The platform 426 can move along the length of the y-axis track 424 to tilt the susceptor in an axis perpendicular to the x-axis. The z-axis motion can be done using a z-axis motor 428 connected to an actuator 429 that moves along the z-axis. The actuator 429 can be mechanically connected to the frame 410 using a plate like that shown in FIG. 10. In some embodiments, the actuator 429 engages the frame 410 by frictional interaction without mechanical fasteners. The stage 420 can have stacked linear tracks like that shown or other shapes including, but not limited to, arc shaped tracks. The stage 420 can be other types of multi-axis components including, but not limited to, tripod and hexapod.

One or more embodiments of the disclosure incorporate vacuum isolation and 4-DOF motion of the susceptor. The motions include rotation about the x-axis, rotation about the y-axis, translation in the z-axis and rotation about the z-axis. The stages of some embodiments are positioned capable of handling the load at the bottom of a stack of carriages almost perpendicular to the load. Accordingly, some embodiments provide bearing support, motion and vacuum isolation in a single component that can be easily separated for simple and reliable integration.

Figure 11:
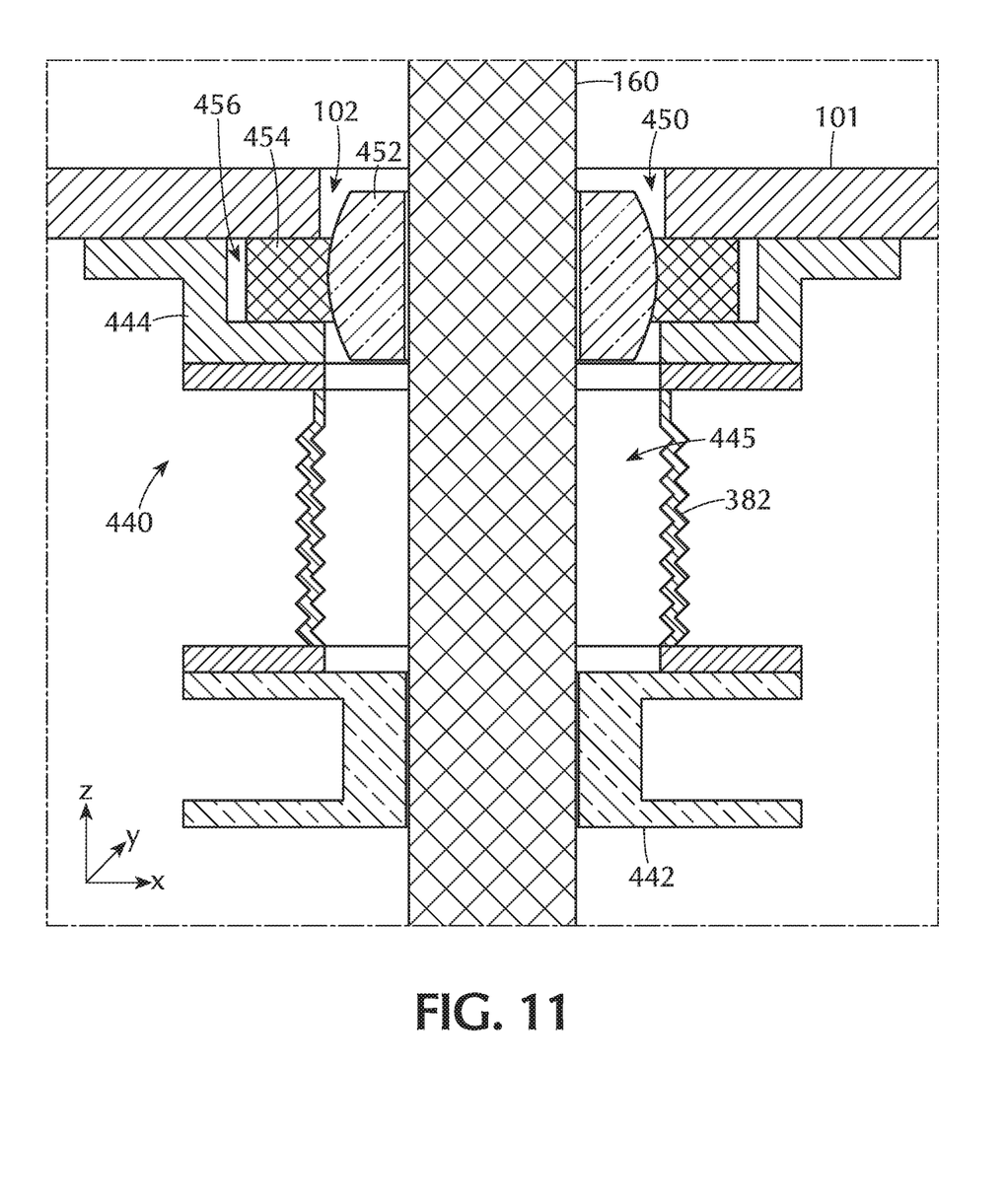
FIG. 11 shows a partial cross-sectional view of a spherical bearing assembly in accordance with one or more embodiment of the disclosure.

Referring to FIG. 11, some embodiments include a bearing assembly 440 between the bellows 382 and the vacuum chamber 101. The bearing assembly shown includes a lip seal 442 (or staged vacuum), a bellows 382 connected to the lip seal 442 and a connection plate 444 between the bellows 382 and the vacuum chamber 101. The bearing assembly 440 creates a vacuum seal between the interior of the vacuum chamber 101 and the atmosphere. Region 445 can be under the same pressure as the vacuum chamber 101 or different pressure and may also include a staged vacuum to ensure that any leakage does not impact the vacuum chamber 101.

Figure 12A:
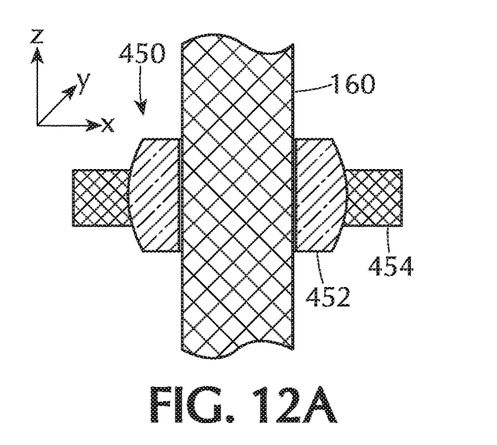
FIGS. 12A and 12B show partial cross-sectional views of a spherical bearing assembly in use in accordance with one or more embodiment of the disclosure.
Figure 12B:
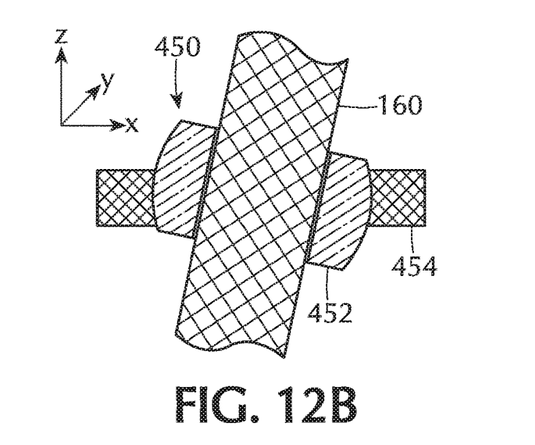

The bearing assembly 440 shown includes a spherical roller bearing 450 positioned around the shaft 160 and forming a seal between the shaft 160 and the vacuum chamber 101. The spherical roller bearing 450 is positioned at the opening 102 of the vacuum chamber 101. The spherical roller bearing 450 has two main components; an inner ring 452 and an outer ring 454. When shaft 160 is rotated about the z-axis, the inner ring 452 rotates as well. The amount of rotation, relative to that of the shaft 160, can be anywhere from completely stopped (i.e., no rotation) or up to the rotation speed of the shaft depending on the type of inner ring 452. In some embodiments, the inner ring 452 rotates at the same speed as the shaft 160. The outer ring 454 remains fixed in place and allows the inner ring 452 to rotate in the x-y plane, that is, about the z-axis. Additionally, the outer ring 454 can allow the inner ring 452 to rotate in the x-z and y-z planes as the susceptor (not shown) is tilted, allowing the shaft 160 to pass through the outer ring 454 in a direction that is not normal to the primary plane of the outer ring 454. FIG. 12A shows a partial view of the spherical roller bearing 450 with the shaft extending normal to the plane of the outer ring 454. FIG. 12B shows a partial view of the spherical roller bearing 450 tilted in the x-z plane so that the shaft 160 is no longer perpendicular to the plane of the outer ring 454. The cross-hatching is used to delineate the different components and does not necessarily refer to the materials making up the individual components. For example, the inner ring, outer ring and shaft can all be made from aluminum, or each component can be a different material. The outer ring 454 shown is positioned in a gap 456 in the connection plate 444. The gap 456 can be sized to securely hold the outer ring and prevent or minimize gas leakage between the region 445 and the interior of the vacuum chamber 101.

In some embodiments, the lip seal 442 is in a fixed location on the shaft 160 so that the lip seal 442 moves with the shaft 160 along the z-axis when the shaft is raised or lowered. The bellows 382 expands and contracts to maintain the vacuum seal between the bottom of the vacuum chamber 101 and the lip seal 442. The lip seal 442 allows rotation of the shaft 160 about the z-axis.

Figure 13:
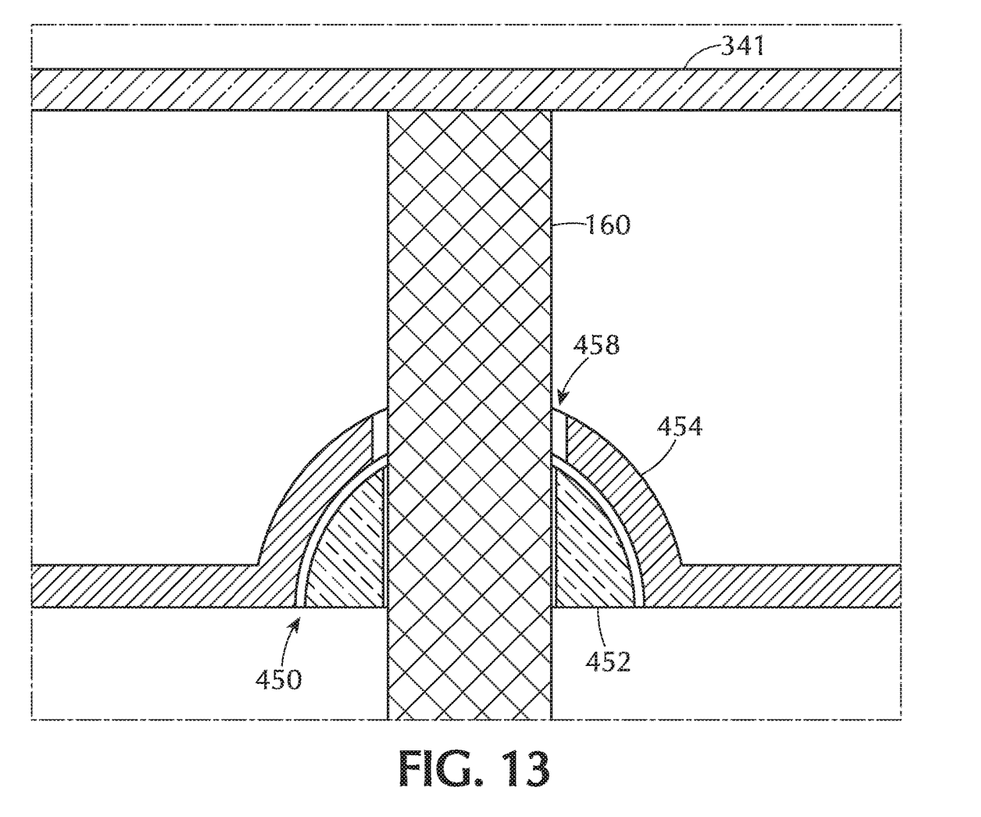
FIG. 13 shows a partial cross-sectional view of a spherical bearing in accordance with one or more embodiment of the disclosure.

FIG. 13 shows another spherical roller bearing 450 where both the inner ring 452 and outer ring 454 are semicircular instead of planar. Like other spherical roller bearings, the tilt of the inner ring 452 within the outer ring 454 is variable depending on the shape and size of the inner and outer rings. In the embodiment of FIG. 13, the amount of tilt that can be applied to the shaft 160 depends on the size of the opening 458 in the outer ring.

Roller bearings that are suitable for use include, but are not limited to, mechanical bearings, air bearings, bearings that support rotation about the x-, y- and z-axes and translation along the z-axis. A staged vacuum or lip seal can be used between the inner ring 452 and outer ring 454, and between the inner ring 452 and the shaft 160. This may provide vacuum barrier while still allowing rotation.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A susceptor assembly comprising:
    a shaft that can support a susceptor; and
    a positioning system comprising a bottom plate, a top plate and at least three actuators positioned between and in contact with the bottom plate and the top plate, each of the actuators having a body and a rod positioned within the body, each rod being slidably movable along an axis of the body to move the top plate closer to or further from the bottom plate, each actuator is in contact with a v-block on the top plate, each v-block having a groove aligned radially with respect to a center of the top plate and facing the bottom plate so that the rod end can move along a length of the groove.

2. The susceptor assembly of claim 1, wherein each of the v-blocks further comprises an end plate positioned at an outer end of the v-block relative to the center of the top plate to prevent the rod end from sliding out of the v-block.

3. The susceptor assembly of claim 1, wherein the shaft extends through the top plate and the bottom plate of the positioning system.

4. A processing chamber comprising:
    a vacuum chamber having a bottom with an opening therethrough;
    a susceptor assembly having a shaft that can support a susceptor and a positioning system comprising a bottom plate, a top plate and at least three actuators positioned between and in contact with the bottom plate and the top plate, each of the actuators having a body and a rod positioned within the body, each rod being slidably movable along an axis of the body to move the top plate closer to or further from the bottom plate, the susceptor assembly positioned so that the shaft extends through the opening in the bottom of the vacuum chamber, each actuator is in contact with a v-block on the top plate, each v-block having a groove aligned radially with respect to a center of the top plate and facing the bottom plate so that the rod end can move along a length of the groove; and
    a susceptor connected to a top of the shaft within the vacuum chamber.

5. The processing chamber of claim 4, further comprising a bellows connecting the top plate to the vacuum chamber to form a gas-tight seal.

6. The processing chamber of claim 5, further comprising a bearing assembly between the bellows and the vacuum chamber.

7. The processing chamber of claim 6, wherein the bearing assembly comprises a spherical roller bearing positioned around the shaft and forming a seal between the shaft and the vacuum chamber.

8. The processing chamber of claim 4, further comprising a theta motor to rotate the shaft.

9. The susceptor assembly of claim 4, wherein each of the v-blocks further comprises an end plate positioned at an outer end of the v-block relative to the center of the top plate to prevent the rod end from sliding out of the v-block.

10. A processing chamber comprising:
    a vacuum chamber having a bottom with an opening therethrough;

the susceptor assembly of claim 1 positioned within the vacuum chamber; and a susceptor connected to a top of the shaft within the vacuum chamber.

11. The processing chamber of claim 10, further comprising a bellows connecting the bottom plate to the vacuum chamber to form a gas-tight seal.

12. A processing chamber comprising:

a vacuum chamber having a bottom with an opening therethrough;

a shaft extending through the opening, the shaft supporting a susceptor within the vacuum chamber;

a bearing assembly including a spherical roller bearing positioned around the shaft to form a seal between the shaft and the vacuum chamber; and a positioning system comprising a bottom plate, a top plate and at least three actuators positioned between and in contact with the bottom plate and the top plate, each of the actuators having a body and a rod positioned within the body, each rod being slidably movable along an axis of the body to move the top plate closer to or further from the bottom plate, each actuator is in contact with a v-block on the top plate, each v-block having a groove aligned radially with respect to a center of the top plate and facing the bottom plate so that the rod end can move along a length of the groove.

13. The processing chamber of claim 12, wherein the bearing assembly further comprises a bellows and a lip seal, the bellows connecting the lip seal to the bottom of the vacuum chamber to form a gas-tight connection.

14. The processing chamber of claim 13, wherein the lip seal moves with the shaft along a z-axis upon raising or lowering the susceptor so that the bellows expands or contracts to maintain a vacuum seal.

15. The processing chamber of any of claim 12, further comprising a showerhead positioned within the vacuum chamber and spaced from a top surface of the susceptor.

16. The processing chamber of claim 15, wherein the stage is configured to align the susceptor to the showerhead to less than about 0.005 inches.

\* \* \* \* \*

UNITED STATES PATENT AND TRADEMARK OFFICE
CERTIFICATE OF CORRECTION

PATENT NO. : 10,597,779 B2
APPLICATION NO. : 15/163857
DATED : March 24, 2020
INVENTOR(S) : William T. Weaver et al.

Page 1 of 1

It is certified that error appears in the above-identified patent and that said Letters Patent is hereby corrected as shown below:

On the Title Page

Item (54), and in the Specification, Column 1, Line 1, Title, replace "RATIONAL" with "ROTATION".

Signed and Sealed this
Twenty-sixth Day of May, 2020

Andrei Iancu
*Director of the United States Patent and Trademark Office*